United States Patent
Mukhopadhy et al.

(10) Patent No.: US 7,253,707 B2
(45) Date of Patent: Aug. 7, 2007

(54) TUNABLE ACTIVE INDUCTOR

(75) Inventors: Rajarshi Mukhopadhy, Atlanta, GA (US); Sebastien Nuttinck, Atlanta, GA (US); Sang-Hyun Woo, Seoul (KR); Jong-Han Kim, Suwon-si (KR); Seong-Soo Lee, Suwon-si (KR); Chang-Ho Lee, Marietta, GA (US); Joy Laskar, Marietta, GA (US)

(73) Assignees: Samsung Electronics Co., Ltd. (KR); Georgia Tech Research Corporation, Atlanta, GA (US)

( * ) Notice: Subject to any disclaimer, the term of this patent is extended or adjusted under 35 U.S.C. 154(b) by 58 days.

(21) Appl. No.: 11/141,123

(22) Filed: May 31, 2005

(65) Prior Publication Data

US 2006/0170523 A1    Aug. 3, 2006

Related U.S. Application Data

(60) Provisional application No. 60/649,221, filed on Feb. 2, 2005.

(51) Int. Cl.
  *H03H 11/00* (2006.01)
  *H03H 11/04* (2006.01)

(52) U.S. Cl. .................................. 333/214; 333/215

(58) Field of Classification Search ............... 333/213, 333/214, 215, 216, 217; 330/252; 331/117 R
See application file for complete search history.

(56) References Cited

U.S. PATENT DOCUMENTS

| | | | | |
|---|---|---|---|---|
| 5,227,681 A | * | 7/1993 | Koyama et al. | 327/65 |
| 5,825,265 A | * | 10/1998 | Fujii | 333/215 |
| 6,028,496 A | * | 2/2000 | Ko et al. | 333/214 |
| 6,765,377 B1 | * | 7/2004 | Lu | 324/123 R |
| 7,075,380 B2 | * | 7/2006 | Singh et al. | 331/117 R |
| 2006/0170512 A1 | * | 8/2006 | Jeon et al. | 331/179 |
| 2006/0197617 A1 | * | 9/2006 | Mukhopadhy et al. | 331/76 |

* cited by examiner

*Primary Examiner*—Dean Takaoka
(74) *Attorney, Agent, or Firm*—The Farrell Law Firm

(57) ABSTRACT

An active inductor capable of tuning a self-resonant frequency, an inductance, a Q factor, and a peak Q frequency by applying a tunable feedback resistor to a cascode-grounded active inductor is disclosed. The tunable active inductor includes a first transistor having a source connected to a power supply voltage and a gate connected to first bias voltage; a second transistor having a drain connected to a drain of the first transistor and a gate connected to a second bias voltage; a third transistor having a drain connected to a source of the second transistor and a source connected to a ground voltage; a fourth transistor having a drain connected to a gate of the third transistor, a source connected to the ground voltage and a gate connected to a third bias voltage; a fifth transistor having a source connected to the drain of the fourth transistor and a drain connected to the power supply voltage.

7 Claims, 5 Drawing Sheets

TUNABLE ACTIVE INDUCTOR

PRIORITY

This application claims the benefit under 35 U.S.C. §119 to a U.S. Provisional Patent Application entitled "TUNABLE ACTIVE INDUCTOR WITH VARIABLE RESISTIVE FEEDBACK AND ITS APPLICATION TO BROADBAND VOC's, filed in the United States patent and Trademark Office on Feb. 2, 2005, and assigned Ser. No. 60/649,221, that contents of which are incorporated herein by reference.

BACKGROUND OF THE INVENTION

1. Field of the Invention

The present invention relates generally to a tunable active inductor, and in particular, to an active inductor with a high quality factor (Q factor) and a wide operating range, available for various radio frequency (RF) devices.

2. Description of the Related Art

With the recent increasing demand for wireless personal communication systems, low-price and integrated processing technologies are required to reduce production cost and system size.

The most preferable technology for wireless communication systems operating at 5 GHz or below to meet this requirement is the Complementary Metal-Oxide Semiconductor (CMOS) technology. However, when standard COMS technology is used for an RF part, the CMOS suffers a loss of microwave signals from silicon substrates with low resistance. It has proven to be extremely difficult to implement a high-quality spiral inductor with silicon substrates having great microwave signal loss.

Recently, therefore, several research groups have implemented the spiral inductor on silicon substrates with a Q factor corresponding to a range of 3 to 10 using multi-level spirals, or implemented the spiral inductor with high-resistance silicon substrates.

As another solution, bonding wires are used to rearrange the spiral inductor. However, this approach is limited to only certain circuit structures.

There also exists a method of implementing an inductor by a CMOS RFIC active element in which equivalent inductive impedance can be generated. Such an active inductor has major advantages of a high Q factor and reduced chip size, and includes latently tunable characteristics that the active inductor can be matched with on-chip filters and networks, and can be applied to LC tank circuits. However, the active inductor has the disadvantages of limited operation frequency range, high-noise characteristic, DC power consumption, and the like.

FIG. 1 is a diagram illustrating a grounded active inductor using a gyrator principle, as an example of a conventional active inductor.

An input impedance of the active inductor of FIG. 1 is defined as:

$$Z_{in}(s) = \frac{g_{ds1} + s(C_{gs2} + C_{gd1} + C_{gd2})}{(g_{ds1} + g_{m1} + sC_{gd2})(g_{m2} + s(C_{gs2} + C_{gd1}))} \quad (1)$$

where $C_{gd1}$ denotes a gate-drain capacitance for a transistor M1, $C_{gs2}$ and $C_{gd2}$ denote a gate-source capacitance and a gate-drain capacitance for a transistor M2, respectively, $g_{m1}$ denotes a transconductance of a current source I1, $g_{m2}$ denotes a transconductance of a current source I2, $g_{ds1}$ denotes an equivalent output conductance for the transistor M1, and 's' equals $j\omega$.

Equation (1) shows an impedance characteristic having one zero and two poles. The zero exists in a place with a frequency of $\omega_z \approx g_{ds1}/(C_{gs2}+C_{gd1}+C_{gd2})$, and the poles exist in a place with a frequency of $\omega_p = g_{m2}/C_{gs2}$.

The active inductor of FIG. 1 has an advantage in that it provides a high gain and a high Q factor with a small size, but has a disadvantage of a very narrow operating frequency range between a zero frequency $\omega_z$ and a gain bandwidth $f_T$ of the transistor M2.

FIG. 2 is a diagram illustrating a cascode-grounded active inductor further including a transistor M3 connected to the drain of the transistor M1 in the active inductor of FIG. 1, as another example of a conventional active inductor. The active inductor of FIG. 2 is an active inductor whose zero frequency $\omega_z$ is reduced by minimizing the output conductance $g_{ds1}$ to widen the operating frequency rage in the active inductor of FIG. 1.

In the active inductor of FIG. 2, although its output impedance $Z_{out}$ increases from adding the transistor M3, the $g_{ds1}$ decreases, causing a decrease in the zero frequency $\omega_z$. As a result, the active inductor of FIG. 2 has a wide operating frequency range. Disadvantageously, however, the active inductor of FIG. 2 has a low gain and a low Q factor.

FIG. 3 is a diagram illustrating a cascode-grounded active inductor further including a feedback resistor $R_f$ in the active inductor of FIG. 2, as another example of a conventional active inductor.

The feedback resistor $R_f$ forms an additional inductive reactance of impedance at the source of the transistor M2. Such an inductive reactance can considerably increase an inductance. In addition, the increase in the inductance increases the Q factor.

Basically, however, the active inductor of FIG. 3 has a disadvantage in that it is impossible to tune an inductance value, a self-resonant frequency $\omega$, and a peak Q frequency $f_Q$. Furthermore, an increase in value of the feedback resistor $R_f$ increases the inductance value but decreases the self-resonant frequency $\omega$ and the peak Q frequency $f_Q$, making it difficult to use a high inductance value at a high frequency.

SUMMARY OF THE INVENTION

Therefore, the present invention aims at providing an active inductor capable of tuning a self-resonant frequency, an inductance, a Q factor, and a peak Q frequency by applying a tunable feedback resistor to a cascode-grounded active inductor.

To achieve the above and other objects, there is provided a tunable active inductor including a first transistor having a source connected to a power supply voltage and a gate connected to first bias voltage; a second transistor having a drain connected to a drain of the first transistor and a gate connected to a second bias voltage; a third transistor having a drain connected to a source of the second transistor and a source connected to a ground voltage; a fourth transistor having a drain connected to a gate of the third transistor, a source connected to the ground voltage and a gate connected to a third bias voltage; a fifth transistor having a source connected to the drain of the fourth transistor and a drain connected to the power supply voltage; and a resistor connected between the drain of the first transistor and a gate of the fifth transistor, a resistance value of the resistor being tunable.

Preferably, the resistor includes a first resistor connected between the drain of the first transistor and the gate of the fifth transistor; and a sixth transistor having a drain connected to the drain of the first transistor, a source connected to the gate of the fifth transistor and a gate connected to a fourth bias voltage. The resistor tunes the resistance value by tuning the fourth bias voltage.

Preferably, the first transistor tunes an output conductance thereof by tuning the first bias voltage. Preferably, the first transistor is a PMOS-type transistor and the fourth transistor is an NMOS-type transistor.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will now be described in detail with reference to the annexed drawings. In the following description, a detailed description of known functions and configurations incorporated herein has been omitted for conciseness.

Figure 1:
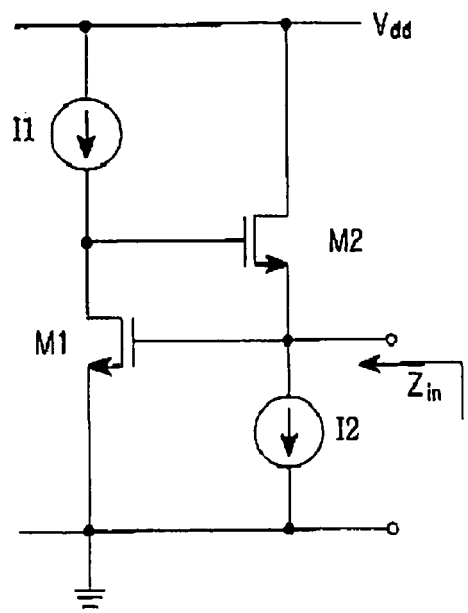
FIG. 1 is a circuit diagram illustrating an example of a conventional active inductor.
Figure 2:
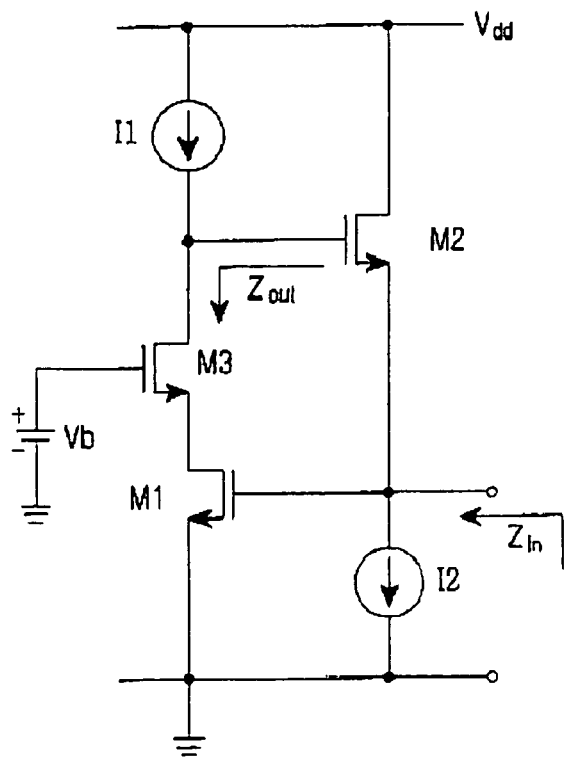
FIG. 2 is a circuit diagram illustrating an example of a conventional active inductor.
Figure 3:
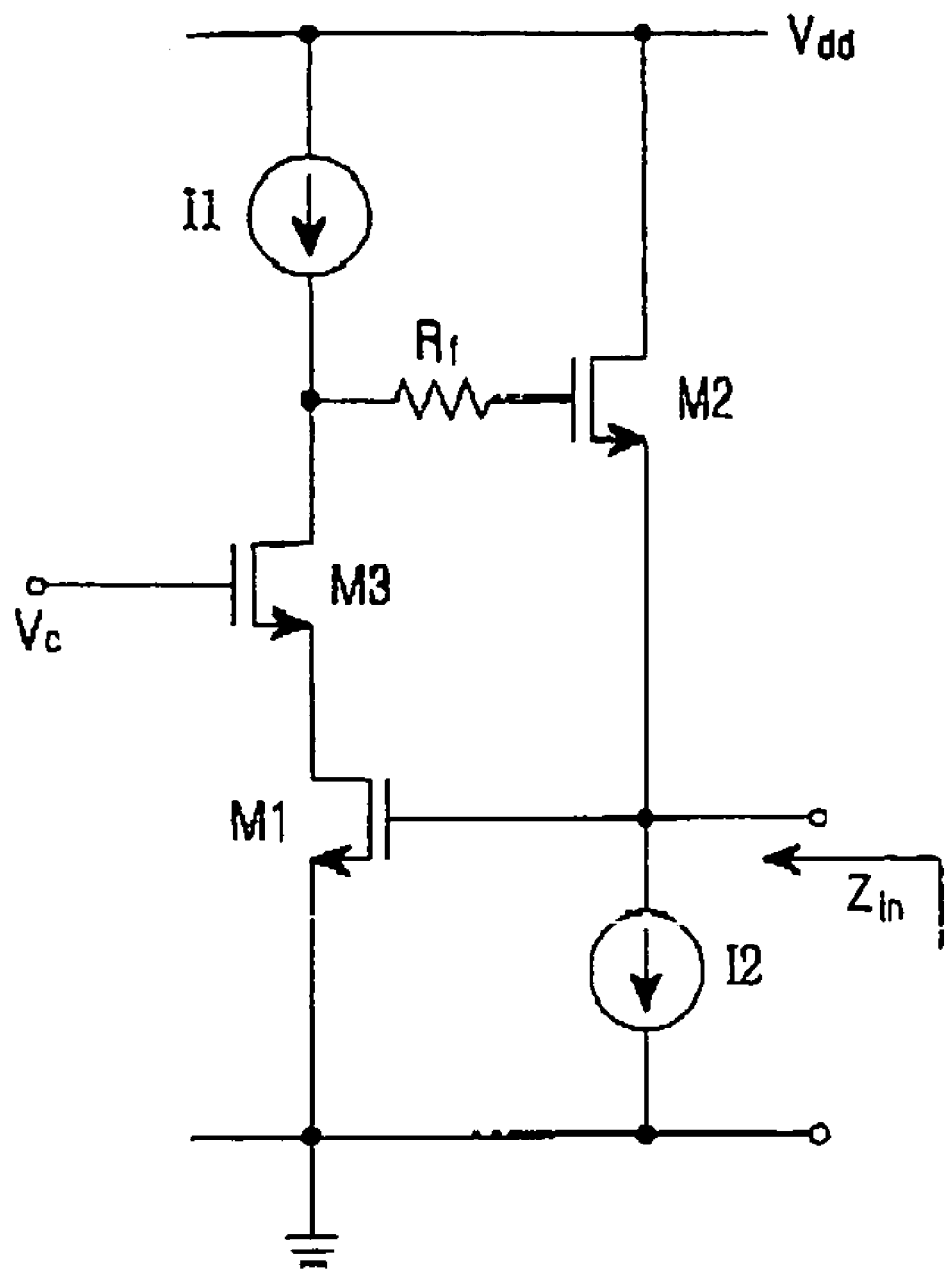
FIG. 3 is a circuit diagram illustrating another example of a conventional active inductor.
Figure 4:
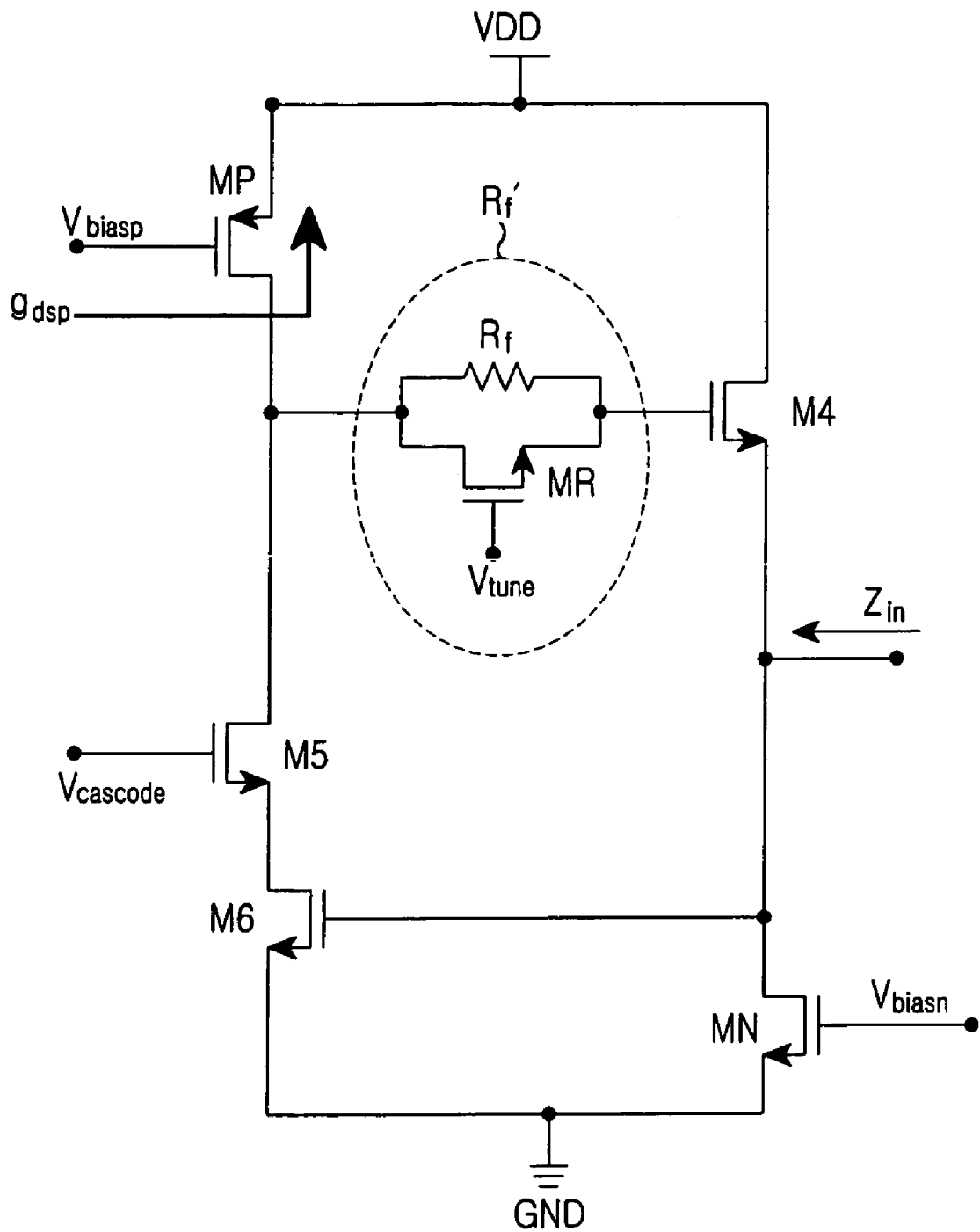
FIG. 4 is a circuit diagram illustrating an active inductor according to an embodiment of the present invention.

FIG. 4 is a circuit diagram of an active inductor according to an embodiment of the present invention. As illustrated in FIG. 4, an active inductor according to an embodiment of the present invention has the cascode-grounded structure with a tunable feedback resistor.

More specifically, the active inductor according to the present invention has a gyrator structure including a transistor M4 and a transistor M6, wherein a transistor M5 is connected to the transistor M6 in a cascode manner, and has a tunable feedback resistor $R_f'$ intervening between a drain of the transistor M5 and a gate of the transistor M4. A transistor MP, which is a PMOS-type transistor, serves as a current source, and a transistor MN, which is an NMOS-type transistor, also serves as a current source. The tunable feedback resistor $R_f'$ includes a resistor $R_f$ and a transistor MR.

Assuming that a value of the $R_f'$ is defined as Equation (2), a Q factor, a peak Q frequency $f_Q$, and a self-resonant frequency ω are calculated by Equation (3) to Equation (5), respectively.

$$R_f' \approx \frac{R_f}{(1 + R_f g_{dsR})} \quad (2)$$

where $g_{dsR}$ denotes an output conductance for the transistor MR.

$$Q \approx \frac{\omega[C_{gs5}(g_{ds5} + g_{dsP}) + C_{gs4}g_{mN}(1 + 2R_f' g_{dsP}) - \omega^2 C_{gs4}^2 C_{gs4}^2 R_f'\{1 + R_f'(g_{ds5} + g_{dsP})\}]}{[g_{mN}g_{dsP} + g_{ds6}(g_{ds5} + g_{dsP}) - \omega^2 C_{gs4} \{C_{gs5}(1 + 2R_f'(g_{ds5} + g_{dsP})) + C_{gs4}(1 + 2R_f' g_{dsP})\}]} \quad (3)$$

where $g_{ds5}$, $g_{ds6}$ and $g_{dsP}$ denote output conductances for the transistors M5, M6 and MP, respectively, $C_{gs4}$ and $C_{gs5}$ denote gate-source capacitances for the transistors M4 and M5, respectively, $g_{mN}$ denotes a transconductance of the transistor MN serving as a current source, and ω denotes a self-resonant frequency.

$$f_Q \approx \frac{1}{2\pi} \sqrt{\frac{g_{mN}g_{dsP} + g_{ds6}(g_{ds5} + g_{dsP})}{C_{gs4}\{C_{gs4}(1 + R_f' g_{dsP}) + C_{gs5}(1 + 2R_f'(g_{ds5} + g_{dsP}))\}}} \quad (4)$$

$$\omega \approx \sqrt{\frac{C_{gs5}(g_{ds5} + g_{dsP}) + C_{gs4}g_{mN}(1 + 2R_f' g_{dsP})}{C_{gs4}^2 C_{gs5} R_f'\{1 + R_f'(g_{ds5} + g_{dsP})\}}} \quad (5)$$

As can be understood from Equation (3) to Equation (5), the active inductor according to an embodiment of the present invention can maintain the Q factor, the peak Q frequency $f_Q$, and the self-resonant frequency ω by tuning the $g_{dsP}$, even though the $R_f'$ increases.

Since the tunable feedback resistor $R_f'$ includes the resistor $R_f$ and the transistor MR, it is possible to tune a resistance of the $R_f'$ by tuning a voltage $V_{tune}$ connected to a gate of the transistor MR. In addition, the $g_{dsP}$ is tuned by tuning a voltage $V_{biasP}$ connected to a gate of the transistor MP.

Figure 5:
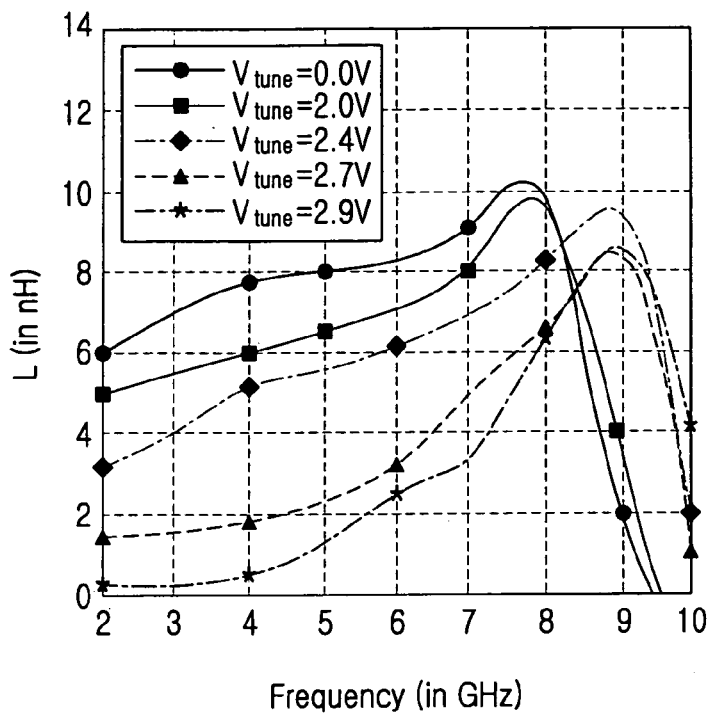
FIG. 5 is a graph illustrating simulation results on an inductance value of an active inductor implemented with SiGe BiCMOSs according to an embodiment of the present invention.
Figure 6:
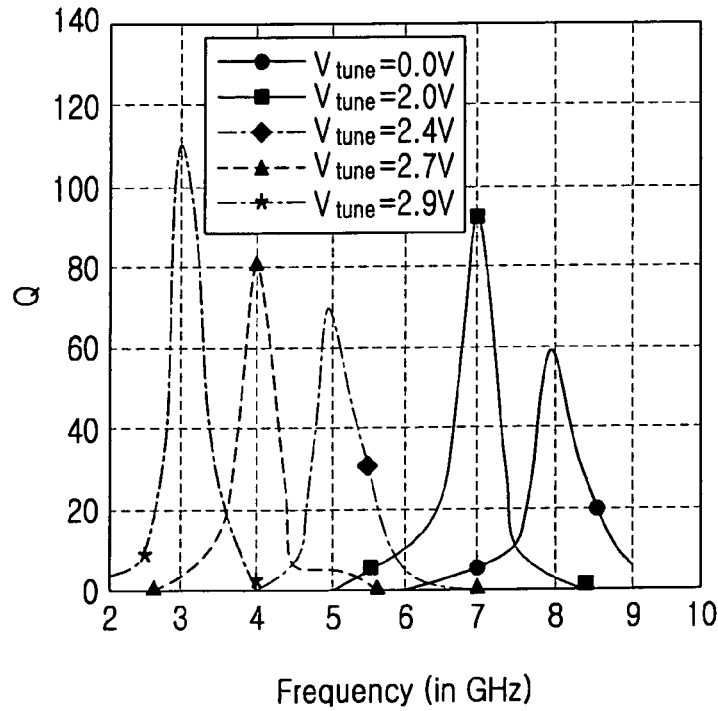
FIG. 6 is a graph illustrating simulation results on a Q factor value of an active inductor implemented with SiGe BiCMOSs according to an embodiment of the present invention.

FIGS. 5 and 6 are graphs illustrating performances measured by tuning the voltage $V_{tune}$ in the active inductor of FIG. 4 implemented with 0.18 μm SiGe BiCMOSs. Specifically, FIG. 5 is a graph illustrating an inductance value according to a change in frequency, and FIG. 6 is a graph illustrating a Q factor value according to a change in frequency. When the novel active inductor is implemented with SiGe BiCMOSs, the inductance value can be realized in the range of 0.1 nH to 8 nH, and the Q factor value can be realized in the range of 2 GHz to 8 GHz.

Figure 7:
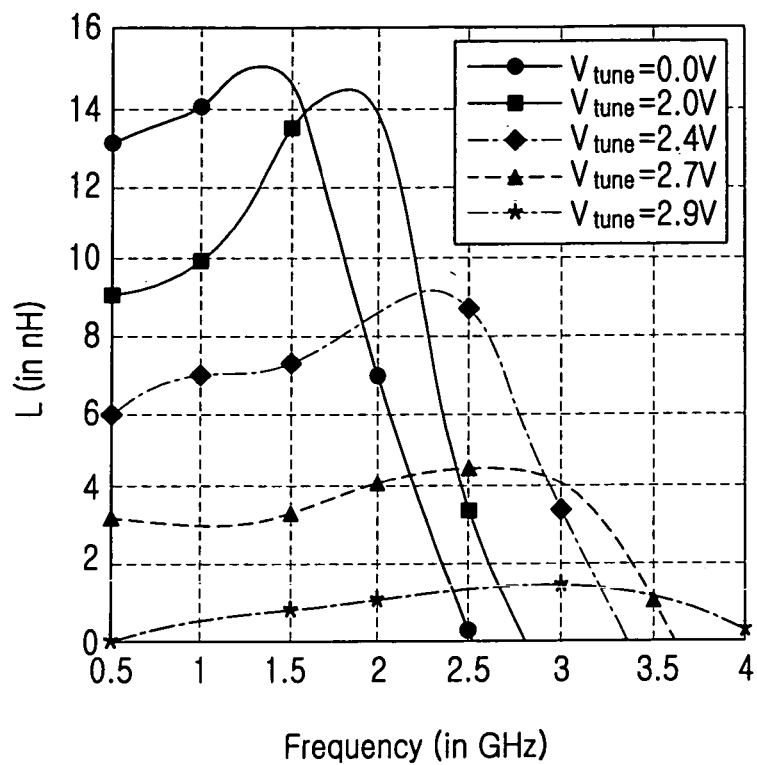
FIG. 7 is a graph illustrating simulation results of an inductance value of an active inductor implemented with Si-CMOSs according to an embodiment of the present invention.
Figure 8:
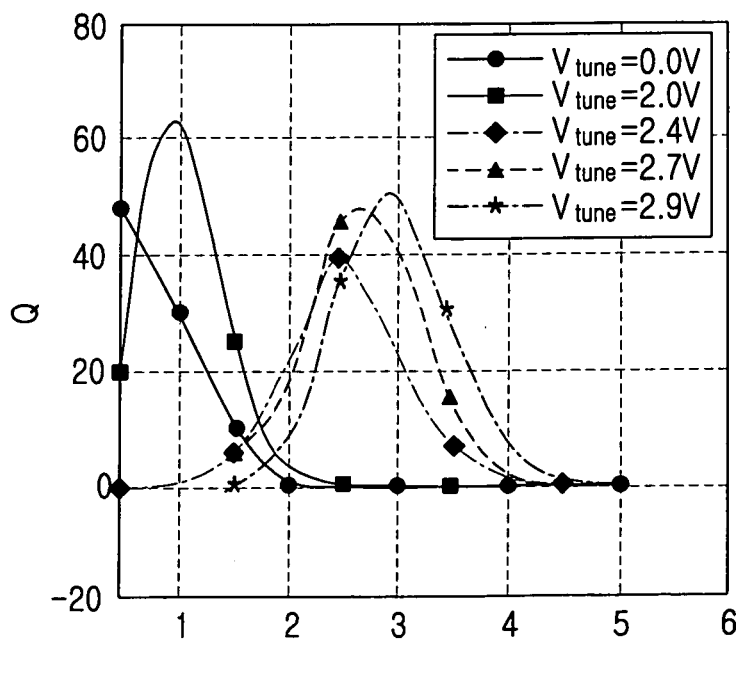
FIG. 8 is a graph illustrating simulation results of a Q factor value of an active inductor implemented with Si-CMOSs according to an embodiment of the present invention.

FIGS. 7 and 8 are graphs illustrating performances measured by tuning the voltage $V_{tune}$ in the active inductor of FIG. 4 implemented with 0.18 μm Si-CMOSs. Specifically, FIG. 7 is a graph illustrating an inductance value according to a change in frequency, and FIG. 8 is a graph illustrating a Q factor value according to a change in frequency. When the novel active inductor is implemented with Si-CMOSs, the inductance value can be realized in the range of 0.1 nH to 15 nH, and the Q factor value can be realized in the range of 0.5 GHz to 3 GHz.

As described above, the active inductor according to an embodiment of the present invention can tune the inductance, the Q factor, the peak Q frequency, and the self-resonant frequency by simply tuning the tunable feedback resistor $R_f'$ and the $g_{dsP}$.

Furthermore, because the Q factor and the peak Q frequency are tuned according to the inductance value, the active inductor according to the present invention has many available frequencies and thus can freely tune the inductance value over a wide frequency range in real time.

In addition, the active inductor according to an embodiment of the present invention can be implemented with a narrow width, contributing to low power consumption.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A tunable active inductor comprising:
   a first transistor having a source connected to a power supply voltage and a gate connected to a first bias voltage;
   a second transistor having a drain connected to a drain of the first transistor and a gate connected to a second bias voltage;
   a third transistor having a drain connected to a source of the second transistor and a source connected to a ground voltage;
   a fourth transistor having a drain connected to a gate of the third transistor, a source connected to the ground voltage and a gate connected to a third bias voltage;
   a fifth transistor having a source connected to the drain of the fourth transistor and a drain connected to the power supply voltage; and
   a resistor connected between the drain of the first transistor and a gate of the fifth transistor, a resistance value of the resistor being tunable.

2. The tunable active inductor of claim 1, wherein the resistor comprises:
   a first resistor connected between the drain of the first transistor and the gate of the fifth transistor; and
   a sixth transistor having a drain connected to the drain of the first transistor, a source connected to the gate of the fifth transistor and a gate connected to a fourth bias voltage.

3. The tunable active inductor of claim 2, wherein the resistor tunes the resistance value by tuning the fourth bias voltage.

4. The tunable active inductor of claim 3, wherein the first transistor tunes an output conductance thereof by tuning the first bias voltage.

5. The tunable active inductor of claim 4, wherein the first transistor is a PMOS-type transistor and the fourth transistor is an NMOS-type transistor.

6. The tunable active inductor of claim 1, wherein the first transistor tunes an output conductance thereof by tuning the first bias voltage.

7. The tunable active inductor of claim 6, wherein the first transistor is a PMOS-type transistor and the fourth transistor is an NMOS-type transistor.

* * * * *